United States Patent
Jen

(10) Patent No.: US 10,021,803 B2
(45) Date of Patent: Jul. 10, 2018

(54) POWER SUPPLY

(71) Applicant: DELTA ELECTRONICS, INC., Taoyuan (TW)

(72) Inventor: Yu-Chi Jen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 180 days.

(21) Appl. No.: 15/054,632

(22) Filed: Feb. 26, 2016

(65) Prior Publication Data

US 2017/0250010 A1 Aug. 31, 2017

(51) Int. Cl.
*H05K 7/06* (2006.01)
*H05K 7/14* (2006.01)

(52) U.S. Cl.
CPC ................. *H05K 7/1432* (2013.01)

(58) Field of Classification Search
CPC . H01B 17/62; H01B 5/14; H05K 5/04; H05K 7/1432; H05K 7/02; H05K 7/06; H05K 1/0256; H05K 5/0052; H05K 5/0056; H05K 5/006; H05K 9/0009
See application file for complete search history.

(56) References Cited

U.S. PATENT DOCUMENTS

| | | | |
|---|---|---|---|
| 5,430,608 A | 7/1995 | Honda et al. | |
| 6,747,875 B2 * | 6/2004 | Wildrick | H05K 3/3426 361/736 |
| 7,042,745 B1 | 5/2006 | Chen | |
| 9,370,093 B2 * | 6/2016 | Miyata | H05K 1/0256 |
| 9,781,849 B2 * | 10/2017 | Negishi | H05K 5/0056 |
| 2008/0293261 A1 * | 11/2008 | Zschieschang | H01L 23/367 439/55 |
| 2010/0025126 A1 * | 2/2010 | Nakatsu | B60L 11/00 180/65.1 |
| 2011/0143021 A1 | 6/2011 | Peterson et al. | |
| 2014/0098498 A1 | 4/2014 | Huang et al. | |
| 2014/0112015 A1 * | 4/2014 | Kurebayashi | H05K 1/0204 362/547 |
| 2015/0145469 A1 * | 5/2015 | You | H02J 7/0042 320/107 |

(Continued)

FOREIGN PATENT DOCUMENTS

| | | |
|---|---|---|
| DE | 102004046251 | 11/2005 |
| EP | 1478218 | 11/2004 |

OTHER PUBLICATIONS

European Search Report dated Aug. 16, 2016 from corresponding application No. EP 16157567.5.

*Primary Examiner* — Hoa C Nguyen
*Assistant Examiner* — Christopher L Augustin
(74) *Attorney, Agent, or Firm* — Hauptman Ham, LLP

(57) ABSTRACT

A power supply includes a metal case, a power conversion module and an insulation connecting plate. The power conversion module is arranged in the metal case and at interval with the metal case. The power conversion module includes a circuit board. The insulation connecting plate is respectively connected with the circuit board and the metal case. The insulation connecting plate is isolated between at least a portion of the circuit board and at least a portion of the metal case. A creepage distance between the metal case and a high voltage area of the circuit board are extended by the insulation connecting plate so as to fulfill the safety requirements.

13 Claims, 11 Drawing Sheets

(56) References Cited

U.S. PATENT DOCUMENTS

2015/0200603 A1* 7/2015 Nam .................. H02M 5/4585
363/37
2015/0214857 A1* 7/2015 Kosuga ................ H02M 7/003
318/400.26
2016/0366771 A1* 12/2016 Schmit .................. H05K 5/006

* cited by examiner

POWER SUPPLY

BACKGROUND OF THE INVENTION

Field of the Invention

The present invention is related to a power supply, in particular to a power supply having an insulation connecting plate.

Description of Related Art

A typical power supply includes a grounding outer casing made of a metal and a conversion module received inside the grounding outer casing in order to convert the voltage of the power source with the conversion module. In general, the conversion module is covered by an insulation film and is isolated as well as insulated from the grounding outer casing. In addition, the conversion module is fastened onto the grounding outer casing and is also grounded onto the grounding outer casing at the same time.

One of the shortcomings of the currently existing technique is that the insulation film must be configured to correspond to the opening hole of the fastening area, causing the creepage distance, as known as the shortest distance between two objects along the insulation surface, between the conversion module and the grounding outer casing to be shortened. In view of the safety required, an electronic component with a higher working voltage shall have a longer creepage distance from the grounding area; therefore, the opening hole would then cause the creepage distance of the area of the conversion module at a higher working voltage to be too short. One of the typical corresponding solutions is to increase the actual distance between the conversion module and the grounding outer casing; however, it would then correspondingly increase the overall volume of the power supply. In addition, another resolution is to reserve a range on the conversion module with the fastening point as a center, and no circuits or electronic components are arranged within such range; however, such solution would lead to a poor utilization rate of the circuit board.

In view of the above, the inventor of the present invention seeks to overcome the aforementioned problems associated with the currently existing techniques after years of research along with the utilization of the academic principles in order to provide an improved solution with objectives of overcoming the existing shortcomings.

SUMMARY OF THE INVENTION

The present invention provides a power supply having an insulation connecting plate.

The present invention provides a power supply comprising a metal case, a power conversion module and an insulation connecting plate. The power conversion module is received inside the metal case and spaced apart from the metal case, and the power conversion module comprises a circuit board. The insulation connecting plate is connected to the circuit board and the metal case respectively, and the insulation connecting plate is arranged to be isolated between at least a portion of the circuit board and at least a portion of the metal case.

The circuit board comprises a high voltage area, and the insulation connecting plate is connected to the high voltage area. The insulation connecting plate is arranged between the high voltage area and the metal case.

The power conversion module is covered by an insulation film in order to isolate and insulate the power conversion module from the metal case. The insulation connecting plate is covered inside the insulation film.

One side the insulation connecting plate includes a plurality of first blind holes formed thereon; the power conversion module is fastened onto the plurality of first blind holes, and the metal case is fastened onto the plurality of second blind holes.

One side the insulation connecting plate includes a plurality of first insulation columns formed thereon, each one of the first insulation columns includes a first blind hole formed thereon respectively, and the first blind hole extends longitudinally along the first insulation column; another side of the insulation connecting plate includes a plurality of second insulation columns, each one of the second insulation columns includes a second blind hole formed thereon respectively, and the second blind hole extends longitudinally along the second insulation column; another side of the insulation connecting plate includes a plurality of second blind holes formed thereon; the power conversion module is fastened onto the plurality of first blind holes, and the metal case is fastened onto the plurality of second blind holes. The power conversion module is covered by an insulation film in order to isolate and insulate the power conversion module from the metal case, the insulation film includes at least one opening hole formed thereon and provided to allow the second insulation column to penetrate therethrough in order to fasten onto the metal case. The opening hole is disposed inside an edge of the insulation connecting plate. The first insulation column can protrude to opposite surfaces of the insulation connecting plate. The second insulation column can protrude to opposite surfaces of the insulation connecting plate.

An inner side of the metal case includes a protruding column protruded therefrom, and the power conversion module is fastened onto the protruding column. The circuit board comprises a low voltage area, and the low voltage area is fastened onto the plurality of protruding columns. The power conversion module is covered by an insulation film in order to isolate and insulate the power conversion module from the metal case, and the insulation film includes at least one opening hole formed thereon and provided to allow the protruding column to penetrate therethrough in order to fasten onto the power conversion module. Each one of the protruding columns includes a fastening hole formed thereon respectively, and the fastening hole extends longitudinally along the protruding column in order to be provided for fastening onto the power conversion module.

The power supply of the present invention provides an insulation connecting plate arranged between the high voltage area of the circuit board of the power conversion module and the metal case such that it is able to increase the creepage distance under the premise where the power supply volume is not increased or the utilization rate of the circuit board is not reduced; therefore, it is able to satisfy the safety requirements.

DETAILED DESCRIPTION OF THE INVENTION

Figure 1:
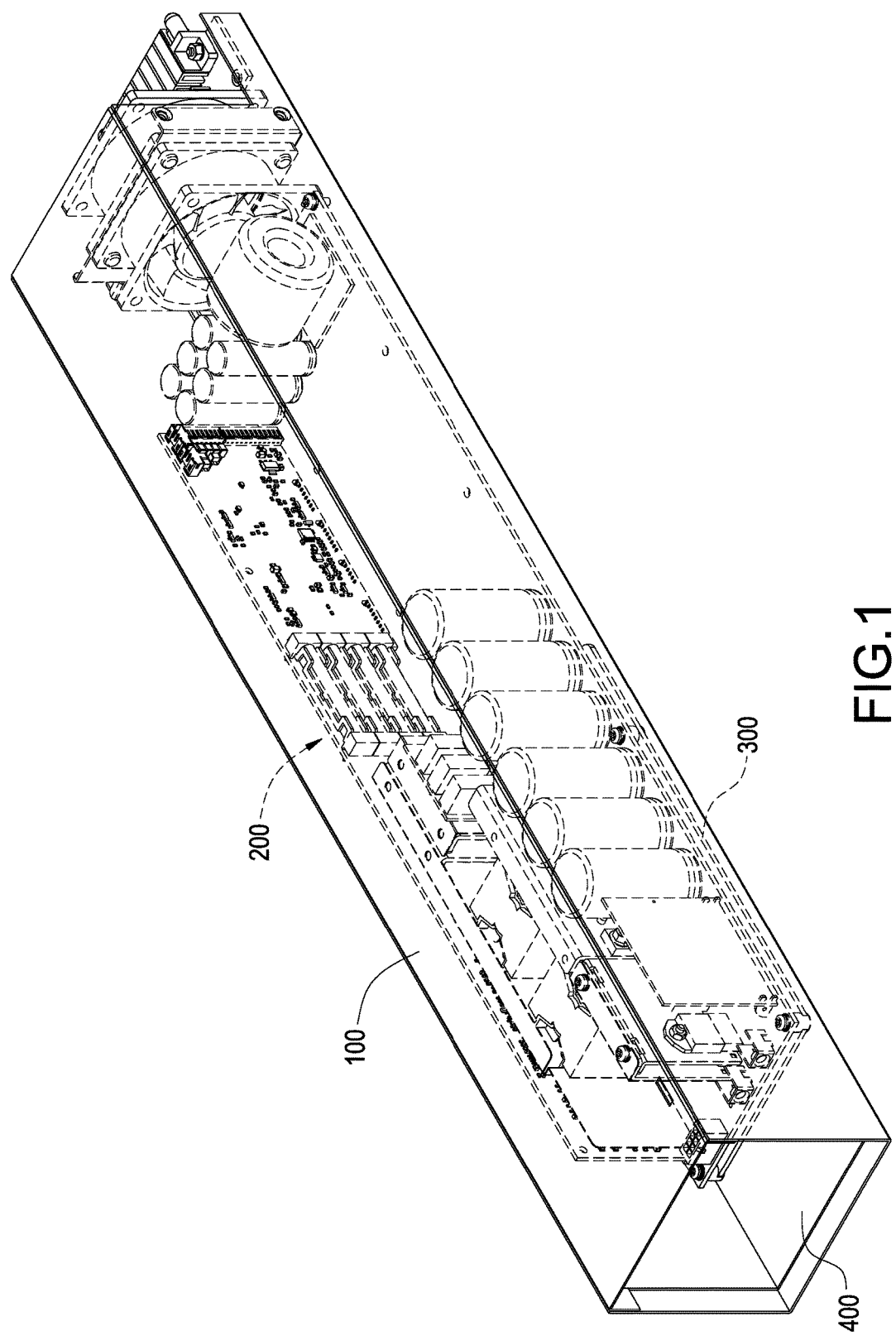
FIG. 1 is a perspective view of the power supply according to a preferred embodiment of the present invention.

As shown in FIG. 1, a power supply according to a preferred embodiment of the present invention is provided, comprising a metal case 100, a power conversion module 200, an insulation connecting plate 300 and an insulation film 400.

Figure 2:
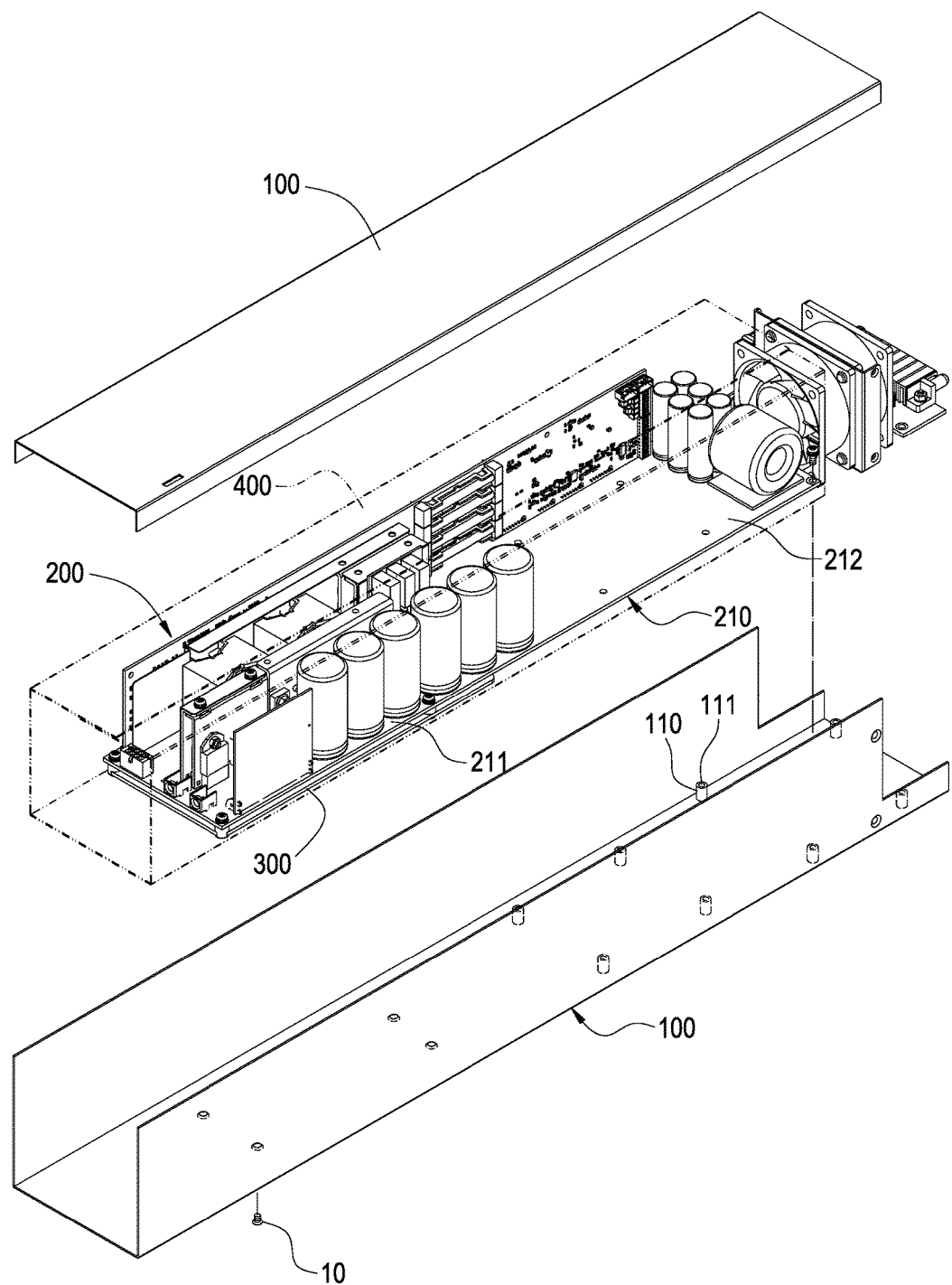
FIG. 2 is a perspective exploded view of the power supply according to the preferred embodiment of the present invention.

As shown in FIG. 1 and FIG. 2, in this embodiment, the metal case 100 is a rectangular box made of a sheet metal, which can also be constructed by a multiple part assembly. In addition, the inner side of the metal case 100 includes a plurality of protruding columns 110 formed thereon, each one of the protruding columns 110 includes a fastening hole 111 formed thereon respectively and provided for fastening, and the fastening hole 111 extends longitudinally along the protruding column 110. The outer shape of the metal case 100 can be modified dependent upon the needs, and the present invention is not limited to any particular outer shapes of the metal case 100.

Figure 3:
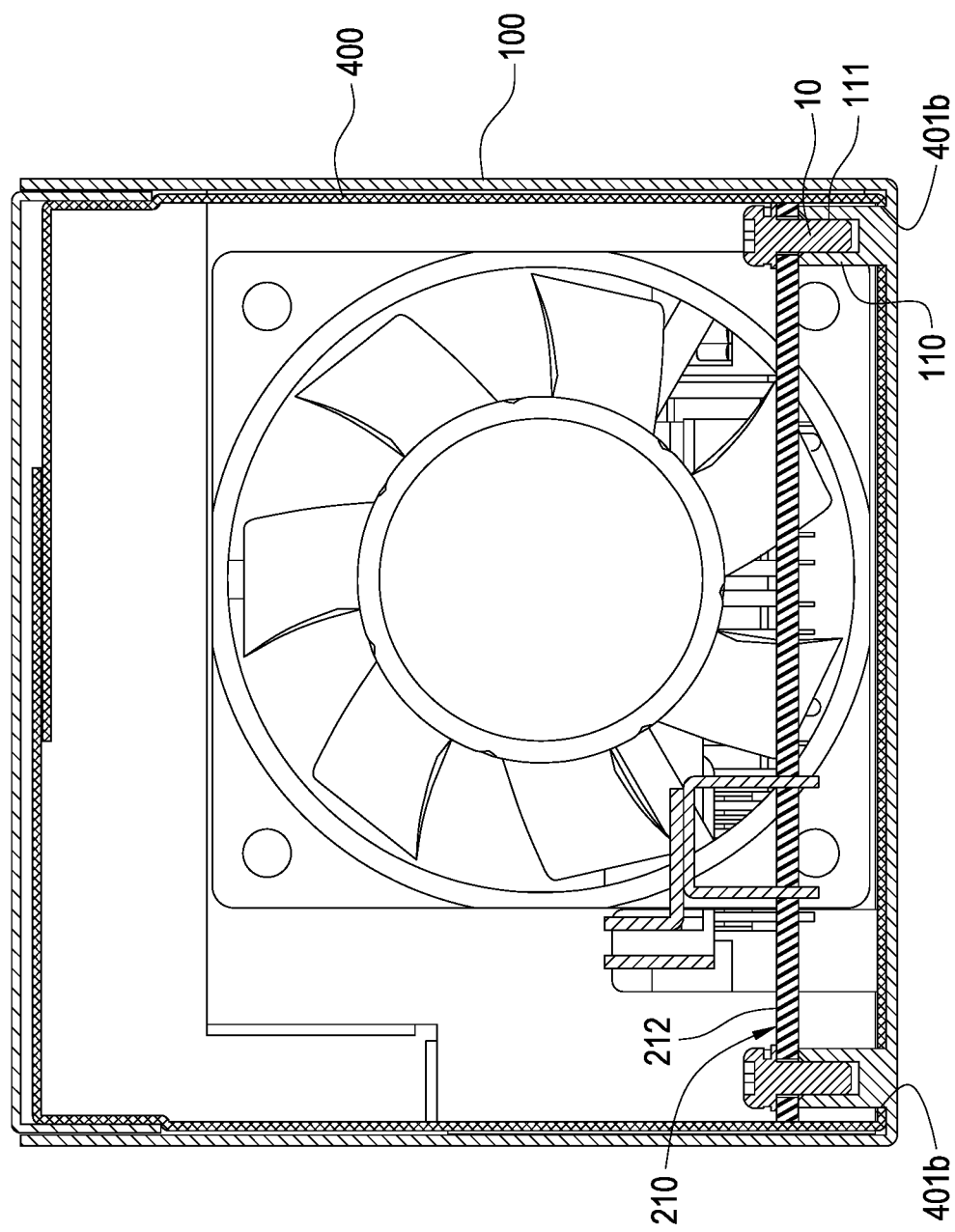
FIG. 3 is an illustration showing the fastening of the protruding columns in the power supply according to the preferred embodiment of the present invention.

As shown in FIGS. 1 to 3, the power conversion module 200 is received inside the metal case 100 and is arranged spaced apart from the metal case 100. In this embodiment, the power conversion module 200 comprises a circuit board 210, and the circuit board 210 comprises a high voltage area 211 and a low voltage area 212. Some electronic components are disposed on the high voltage area 211 and the low voltage area 212 respectively in order to perform the power source voltage conversion via such areas. The low voltage area 212 of the circuit board 210 of the power conversion module 200 uses screws 10 for fastening onto the protruding columns 110 inside the metal case 100 for securement thereof.

Figure 4:
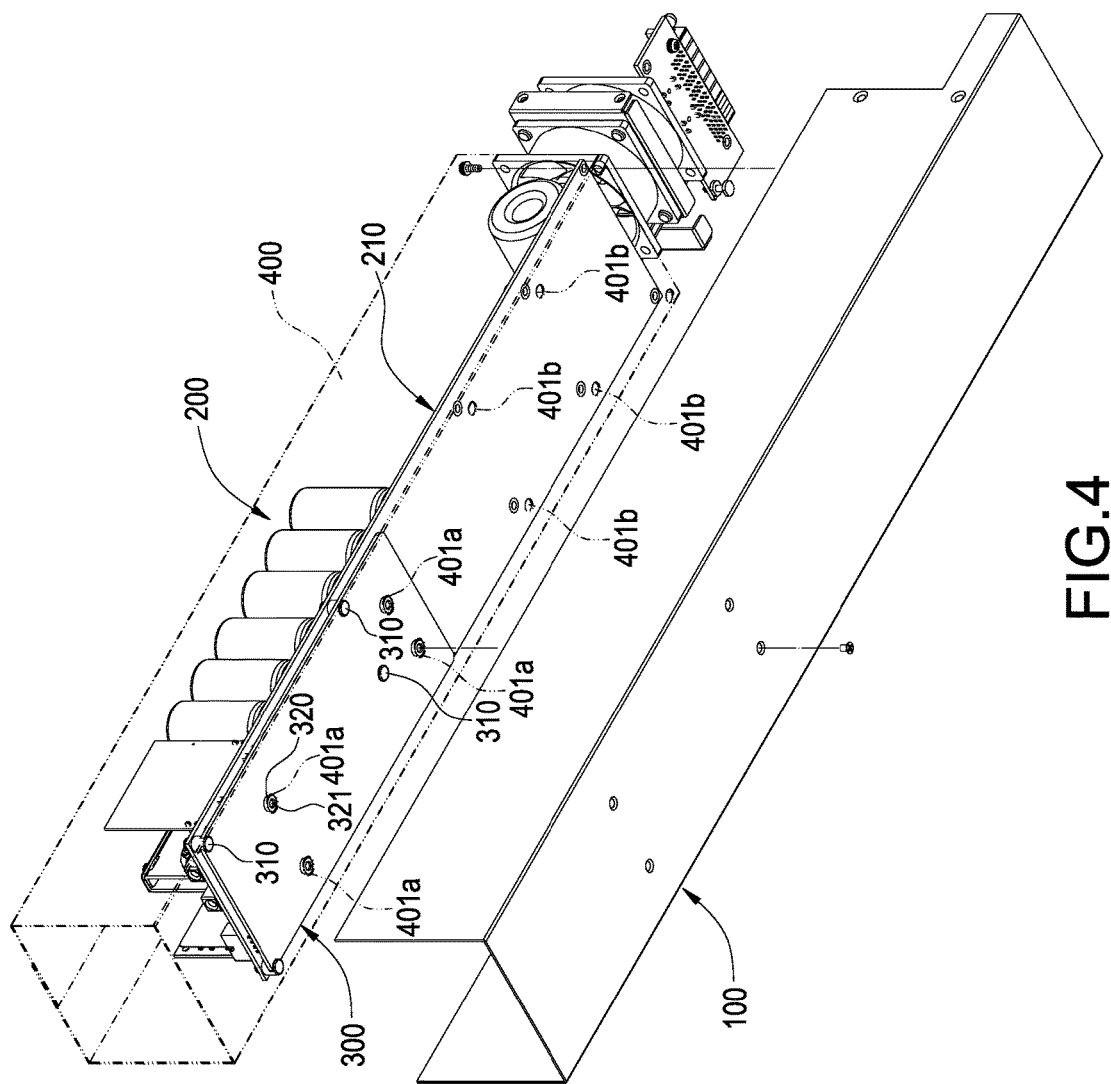
FIG. 4 is another perspective exploded view of the power supply according to the preferred embodiment of the present invention.

As shown in FIG. 2 and FIG. 4, the insulation connecting plate 300 is connected to the circuit board 210 and the metal case 100 respectively in order to secure the power conversion module 200 inside the metal case 100. In this embodiment, the insulation connecting plate 300 is arranged to isolate between the high voltage area 211 of the circuit board 210 and the metal case 100. In addition, the insulation connecting plate 300 is respectively fastened onto the high voltage area 211 of the circuit board 210 and the metal case 100.

Figure 5:
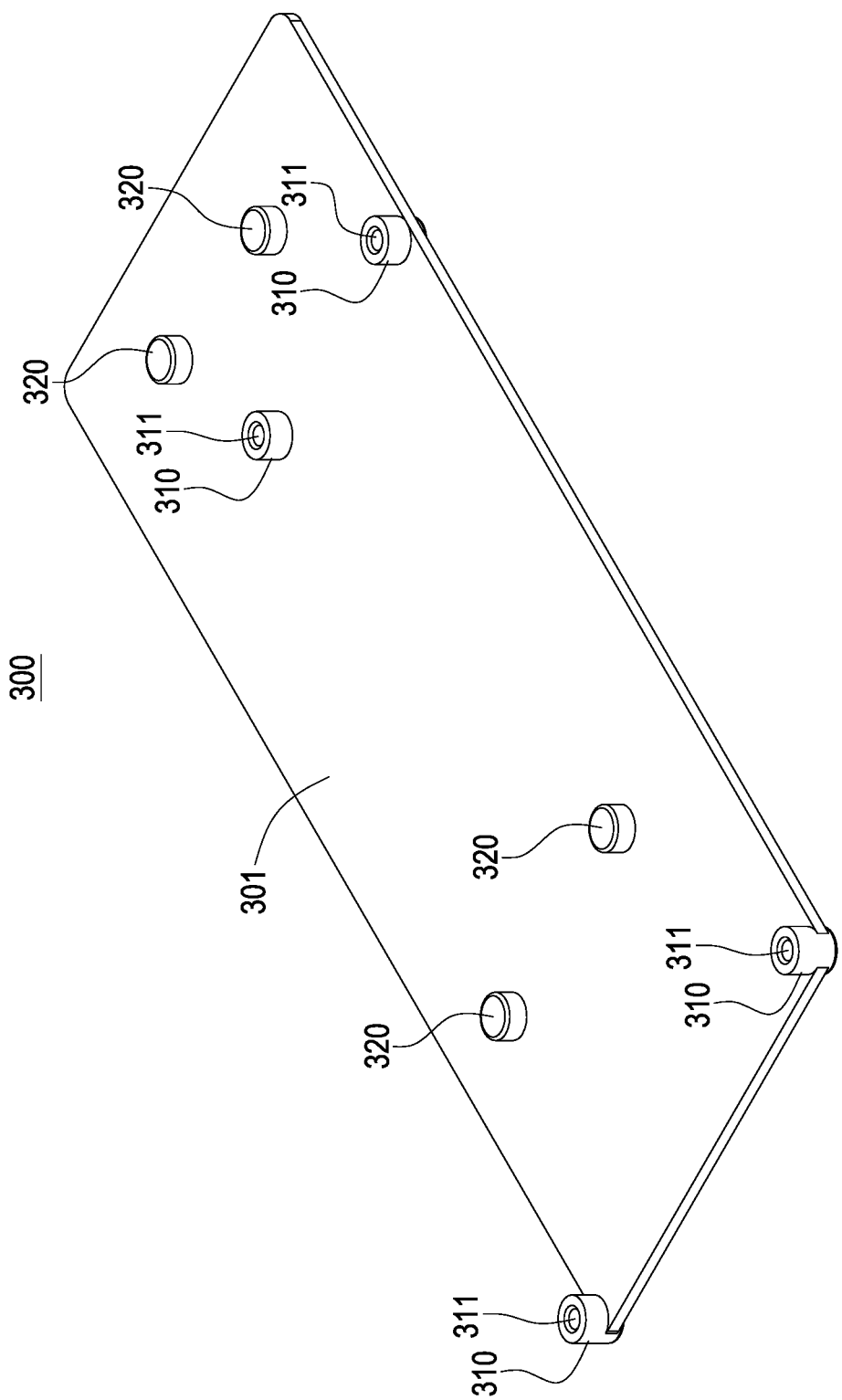
FIG. 5 is a perspective view of the insulation connecting plate in the power supply according to the preferred embodiment of the present invention.
Figure 6:
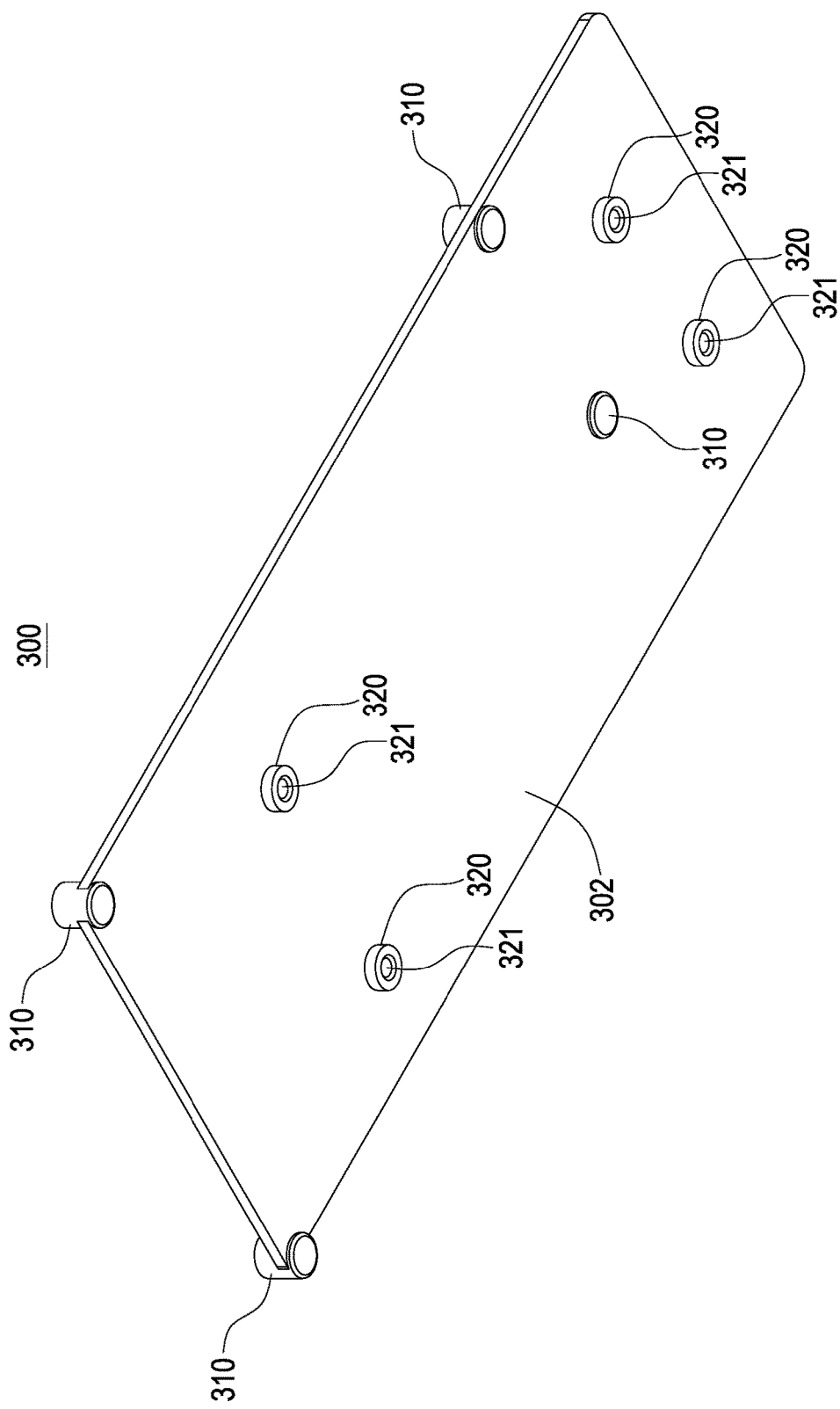
FIG. 6 is another perspective view of the insulation connecting plate in the power supply according to the preferred embodiment of the present invention.

As shown in FIG. 5 and FIG. 6, the connection method adopted to connect the insulation connecting plate 300 with the circuit board 210 and the metal case 100 is described in detail as follows. The two sides of the insulation connecting plate 300 refer to a first surface 301 and a second surface 302 opposite from the first surface 301 respectively. The first surface 301 includes a plurality of first blind holes 311 formed thereon, and the second surface 302 includes a plurality of blind holes 321 formed thereon. Preferably, the first surface 301 includes a plurality of first insulation columns 310 protruded therefrom, and the first blind holes 311 are formed on each one of the first insulation columns 310 respectively. In addition, each one of the first blind holes 311 extends longitudinally along the first insulation column 310. The second surface 302 includes a plurality of second insulation columns 320 protruded therefrom, and the second blind holes 321 are formed on each one of the second insulation columns 320 respectively. In addition, each one of the second blind holes 321 extends longitudinally along the second insulation column 320.

Figure 7:
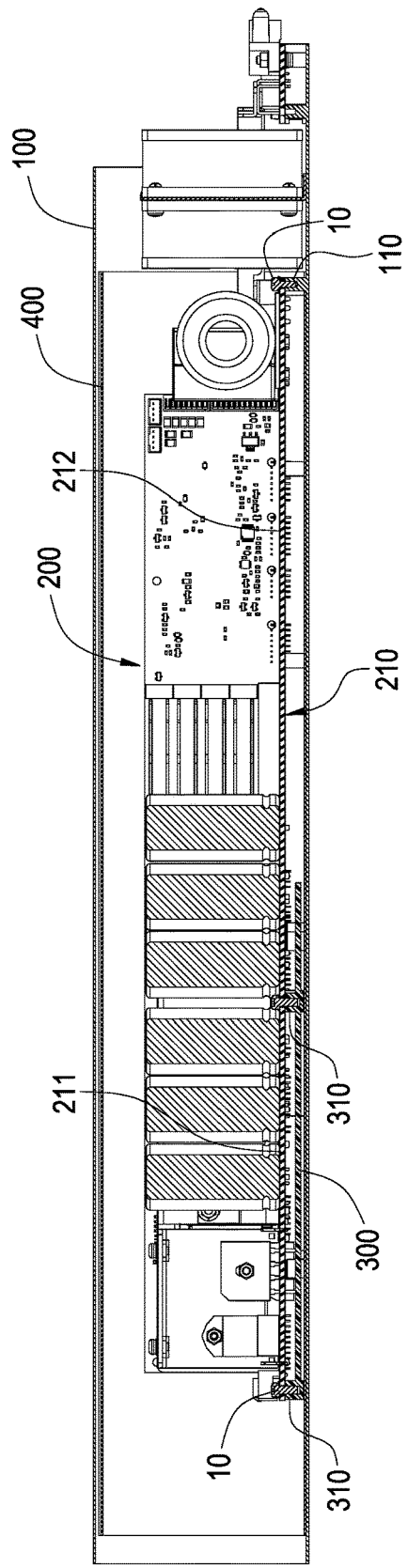
FIG. 7 is a longitudinal cross sectional view of the power supply according to the preferred embodiment of the present invention.
Figure 8:
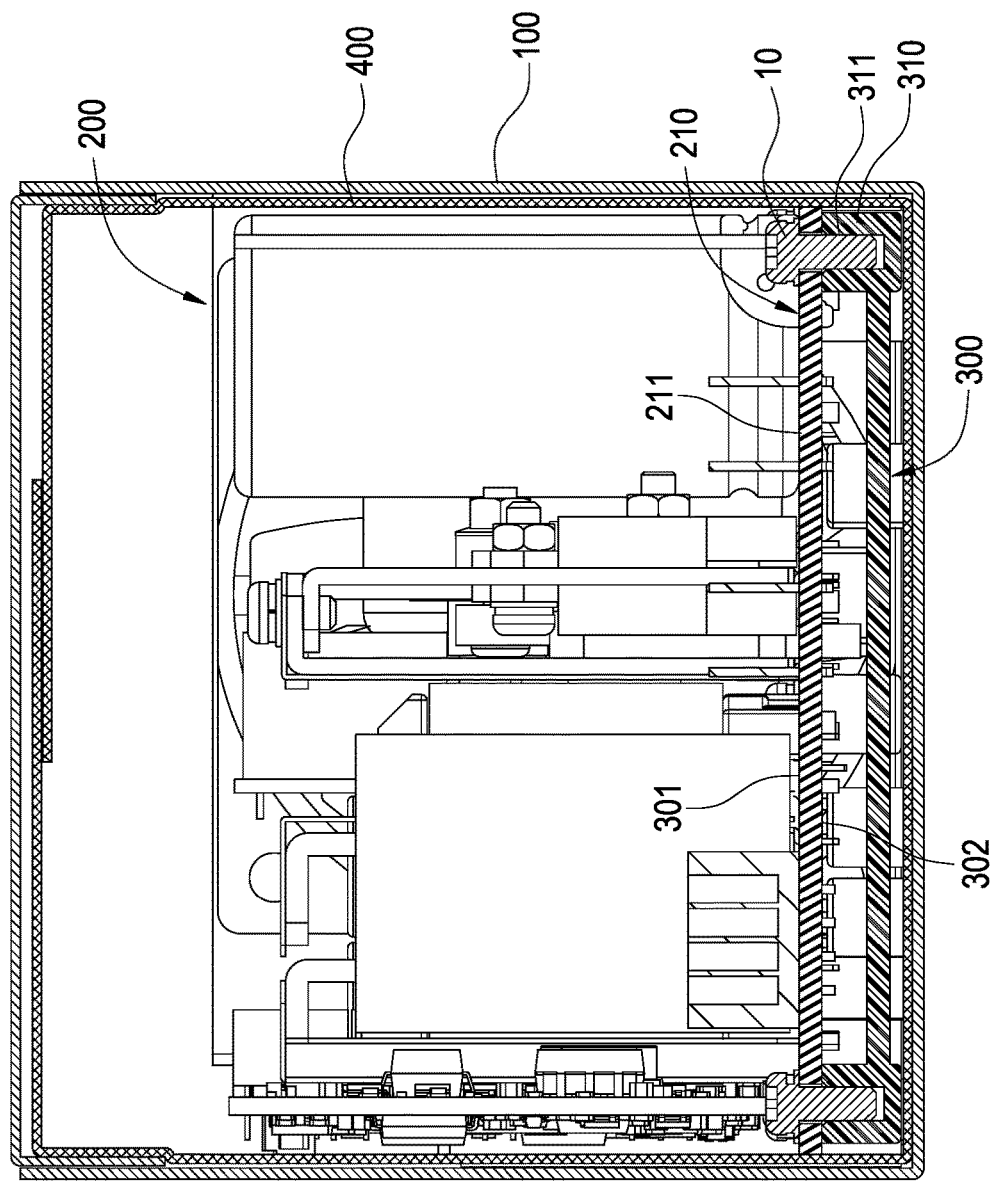
FIG. 8 is an illustration showing the fastening of the first blind holes in the power supply according to the preferred embodiment of the present invention.
Figure 9:
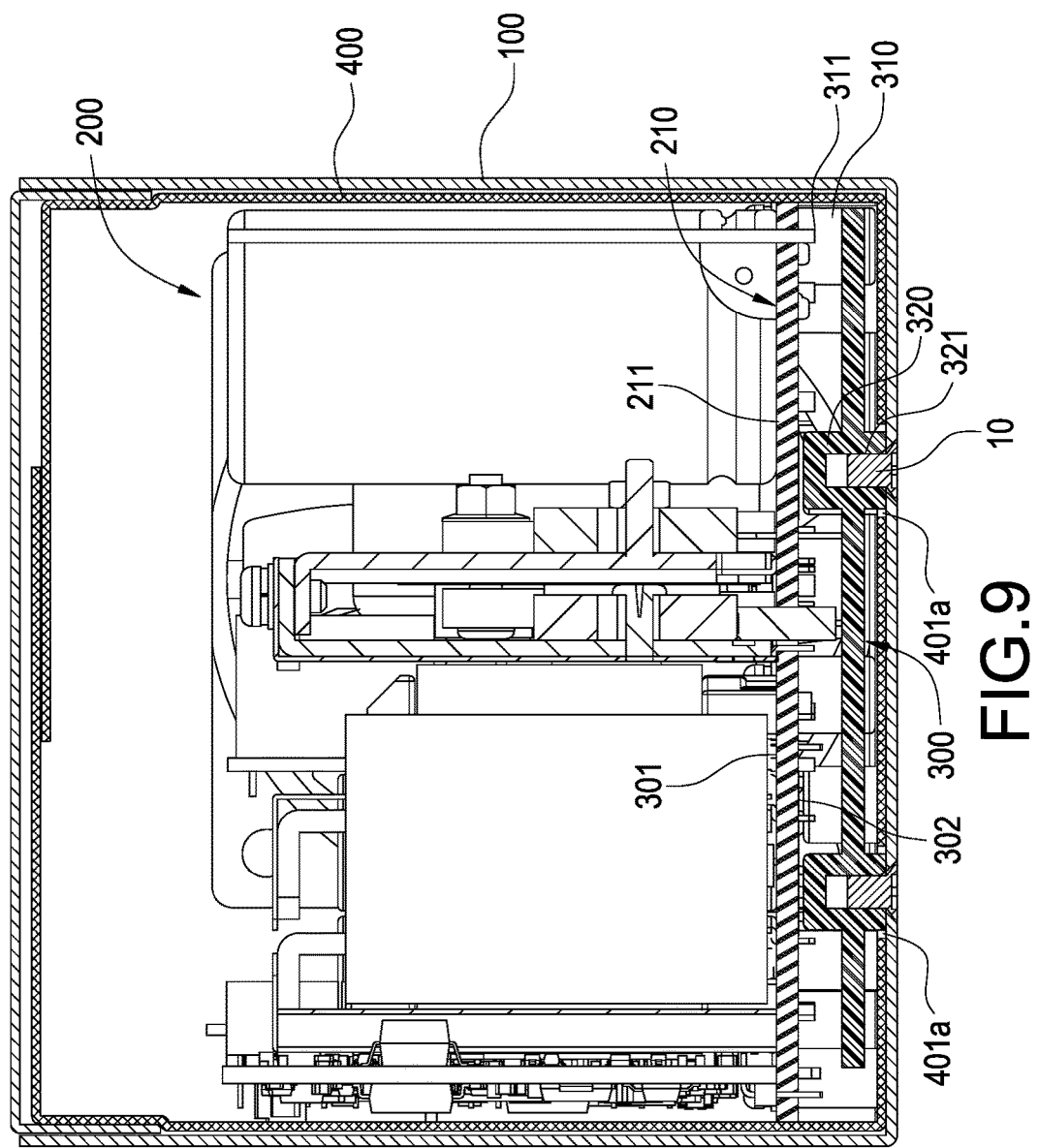
FIG. 9 is an illustration showing the fastening of the second blind holes in the power supply according to the preferred embodiment of the present invention.

As shown in FIG. 7 and FIG. 9, the high voltage area 211 of the circuit board 210 uses the screws 10 for fastening onto the first blind holes 311 for securement thereof, and the metal case 100 uses the screws 10 for fastening onto the second blind holes 321 for securement thereof such that the power conversion module 200 is secured inside the metal case 100. The first insulation column 310 and the second insulation column 320 must have sufficient lengths in order to be provided for fastening; preferably, the first insulation column 310 can protrude to the second surface 302 of the insulation connecting plate 300, and the second insulation column 320 can also protrude to the first surface 301 of the insulation connecting plate 300; therefore, the overall thickness of the insulation connecting plate 300 can be reduced.

Figure 10:
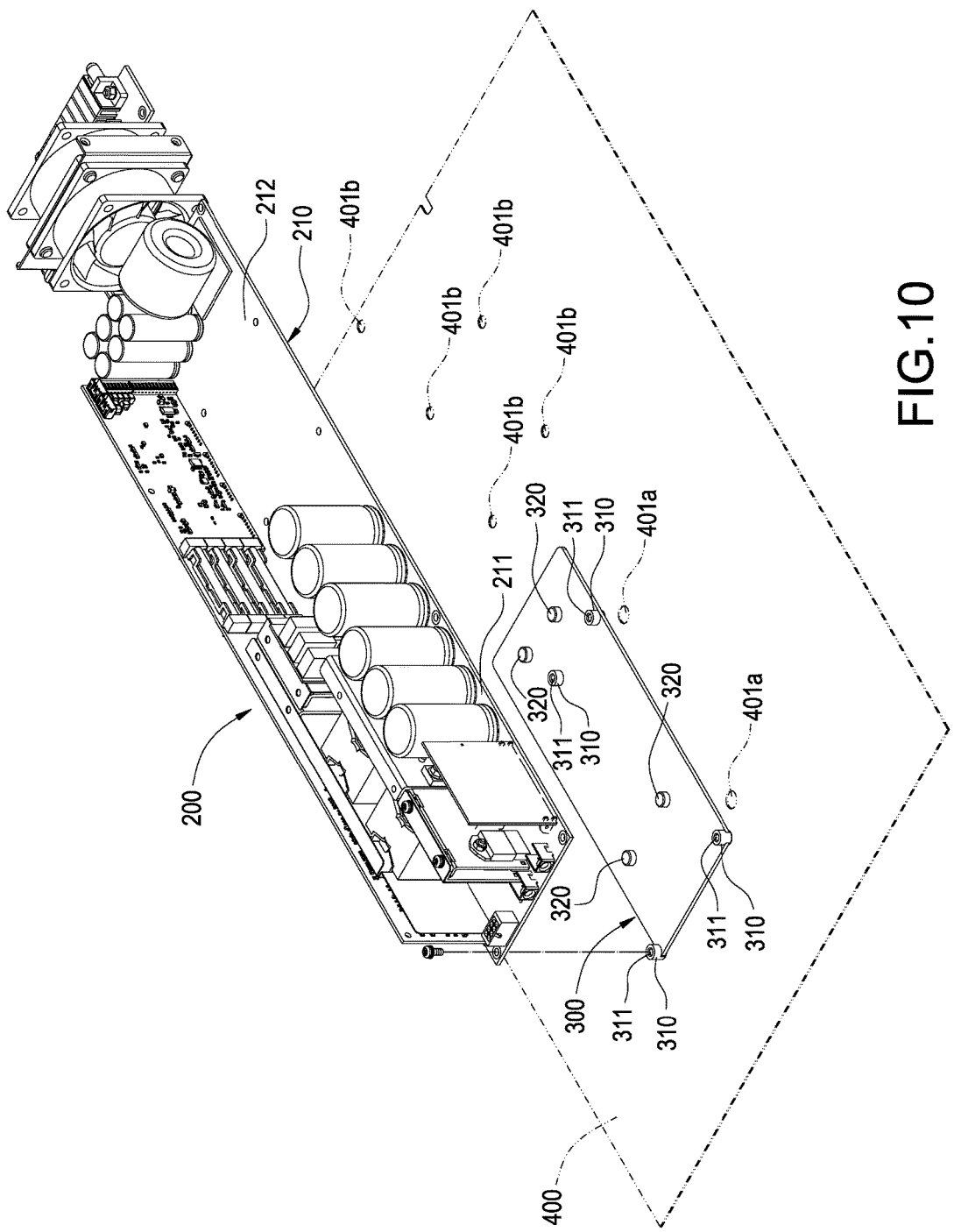
FIG. 10 is an illustration showing the arrangement of the insulation film in the power supply of the present invention.

As shown in FIG. 2, FIG. 4 and FIG. 10, the insulation film 400 is made of an insulative paper. The insulation film 400 is folded to cover the power conversion module 200 in order to isolate and insulate the power conversion module 200 from the metal case 100.

Figure 11:
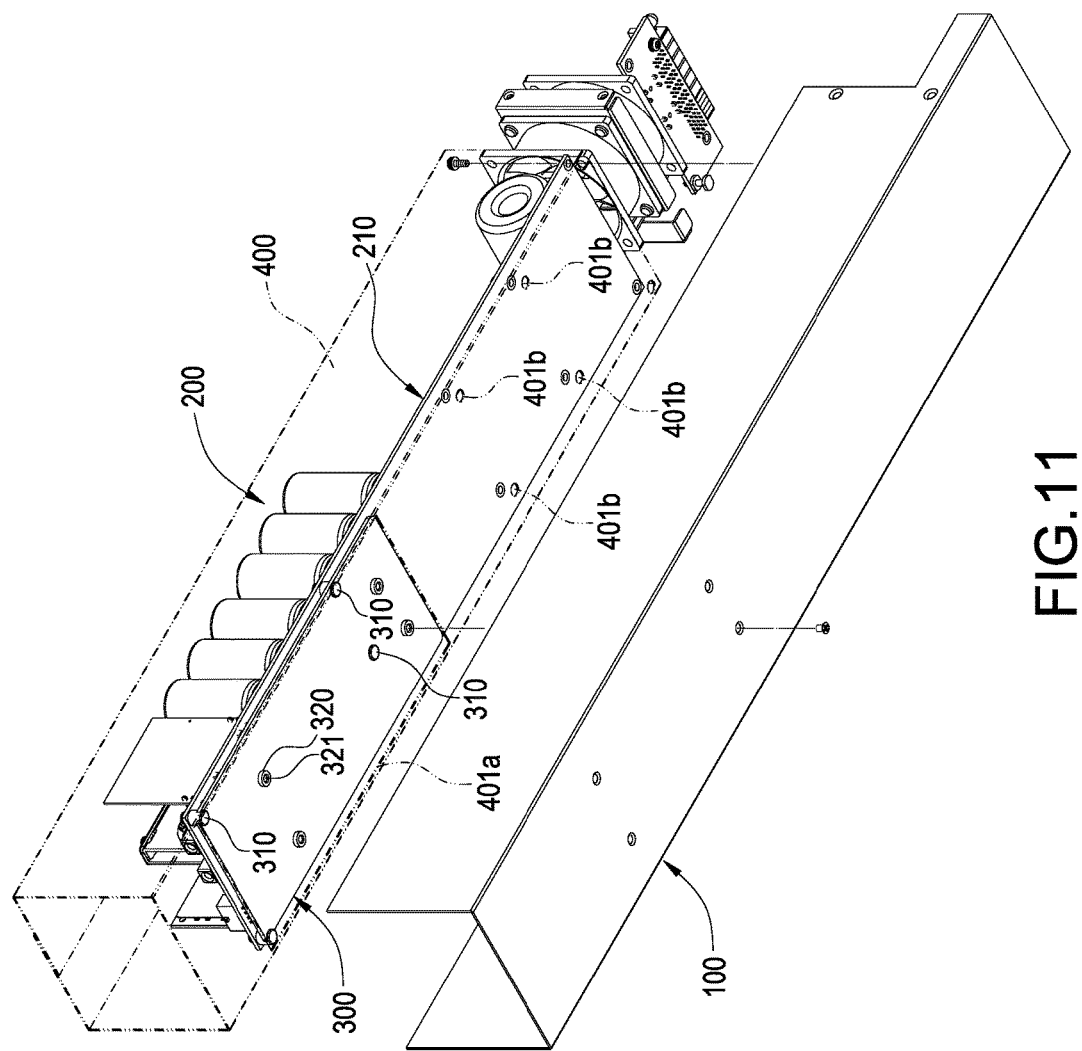
FIG. 11 is an illustration showing another form of the insulation film in the power supply of the present invention.

As shown in FIG. 7 to FIG. 10, in this embodiment, the insulation film 400 includes a plurality of opening holes 401a, 401b formed thereon. A portion of the opening holes 401a is disposed inside the edge of the insulation connecting plate 300, and each one of the opening holes 401a is respectively provided to allow the corresponding second insulation column 320 to penetrate therethrough in order to fasten onto the metal case 100. In this embodiment, the insulation connecting plate 300 is covered inside the insulation film 400; however, it can also be configured in such a way, as shown in FIG. 11, a greater opening hole 401a is formed to allow a multiple of second insulation columns 320 to penetrate therethrough in order to fasten onto the metal case 100. When an opening hole 401a is formed to have a dimension identical to that of the insulation connecting plate 300, then the insulation connecting plate 300 is not covered by the insulation film 400. Another portion of the opening holes 401b is disposed outside the edge of the insulation connecting plate 300 and are provided to allow the protruding column 110 to penetrate therethrough in order to fasten onto the low voltage area 212 of the circuit board 210 of the power conversion module 200.

The power supply of the present invention provides the insulation connecting plate 300 arranged between the high voltage area of the circuit board 210 of the power conversion module 200 and the metal case 100 in order to increase the creepage distance between the high voltage area 211 and the metal case 100 without increasing the volume of the power supply as well as without reducing the utilization rate of the circuit board 210.

The preferred embodiments of the present invention described above are provided for illustration purposes only and shall not be treated as limitations of the scope of the present invention. Other equivalent variations utilizing the spirit of the patent of the present invention shall also be considered to be within the scope of the present invention.

What is claimed is:

1. A power supply, comprising:
a metal case,
a power conversion module received inside the metal case and spaced apart from the metal case, the power conversion module comprising a circuit board; and
an insulation connecting plate connected to the circuit board and the metal case respectively, the insulation connecting plate being isolated between at least a portion of the circuit board and at least a portion of the metal case,
wherein
one side of the insulation connecting plate includes a plurality of first insulation columns formed thereon, each one of the first insulation columns includes a first blind hole formed thereon, and the first blind hole extends longitudinally along the first insulation column,
another side of the insulation connecting plate includes a plurality of second insulation columns, each one of the second insulation columns includes a second blind hole formed thereon respectively, and the second blind hole extends longitudinally along the second insulation column, and
the power conversion module is fastened onto the plurality of first blind holes, a plurality of screws are arranged penetrating the metal case from outside of the metal case and screw connected with the second blind holes and the metal case is thereby fastened onto the plurality of second blind holes.

2. The power supply according to claim 1, wherein the circuit board comprises a high voltage area, and the insulation connecting plate is connected to the high voltage area.

3. The power supply according to claim 2, wherein the insulation connecting plate is arranged between the high voltage area and the metal case.

4. The power supply according to claim 1, wherein the power conversion module is covered by an insulation film in order to isolate and insulate the power conversion module from the metal case.

5. The power supply according to claim 4, wherein the insulation connecting plate is covered inside the insulation film.

6. The power supply according to claim 1, wherein the power conversion module is covered by an insulation film in order to isolate and insulate the power conversion module from the metal case, the insulation film includes at least one opening hole formed thereon and provided to allow the second insulation columns to penetrate therethrough in order to fasten onto the metal case.

7. The power supply according to claim 6, wherein the opening hole is disposed inside an edge of the insulation connecting plate.

8. The power supply according to claim 1, wherein the first insulation columns of the plurality of first insulation columns protrude away from a surface of the insulation connecting plate.

9. The power supply according to claim 1, wherein the second insulation columns of the plurality of second insulation columns protrude away from a surface of the insulation connecting plate.

10. The power supply according to claim 1, wherein an inner side of the metal case includes a protruding column protruded therefrom, and the power conversion module is fastened onto the protruding column.

11. The power supply according to claim 10, wherein the circuit board comprises a low voltage area, and the low voltage area is fastened onto the protruding column.

12. The power supply according to claim 10, wherein the power conversion module is covered by an insulation film in order to isolate and insulate the power conversion module from the metal case, and the insulation film includes at least one opening hole formed thereon and provided to allow the protruding column to penetrate therethrough in order to fasten onto the power conversion module.

13. The power supply according to claim 10, wherein the protruding column includes a fastening hole formed thereon, and the fastening hole extends longitudinally along the protruding column in order to be provided for fastening onto the power conversion module.

* * * * *